United States Patent
Kusunoki et al.

(10) Patent No.: US 8,181,571 B2
(45) Date of Patent: May 22, 2012

(54) PRINTING DEVICE AND PRINTING METHOD

(75) Inventors: Toshiyuki Kusunoki, Iwata (JP); Hidetoshi Sato, Iwata (JP); Masataka Aiba, Narita (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 399 days.

(21) Appl. No.: 12/306,699

(22) PCT Filed: Jun. 28, 2007

(86) PCT No.: PCT/JP2007/062976
§ 371 (c)(1),
(2), (4) Date: Dec. 26, 2008

(87) PCT Pub. No.: WO2008/001838
PCT Pub. Date: Jan. 3, 2008

(65) Prior Publication Data
US 2009/0193986 A1    Aug. 6, 2009

(30) Foreign Application Priority Data

Jun. 29, 2006    (JP) .................................. 2006-179859

(51) Int. Cl.
*B41L 13/00*    (2006.01)
(52) U.S. Cl. ...................................... 101/127.1; 101/114
(58) Field of Classification Search .............. 101/127.1
See application file for complete search history.

(56) References Cited

U.S. PATENT DOCUMENTS

| | | | | |
|---|---|---|---|---|
| 4,307,662 A | * | 12/1981 | Mitter | 101/123 |
| 4,455,935 A | * | 6/1984 | Manz et al. | 101/35 |
| 5,036,760 A | | 8/1991 | Oozeki | |
| 5,050,496 A | * | 9/1991 | Klemm | 101/123 |
| 6,726,195 B1 | * | 4/2004 | Hertz et al. | 269/266 |
| 6,853,874 B2 | * | 2/2005 | Kawada et al. | 700/213 |
| 7,509,909 B2 | * | 3/2009 | Bourrieres et al. | 101/127.1 |
| 2004/0089169 A1 | * | 5/2004 | Flatt | 101/127.1 |
| 2005/0223919 A1 | * | 10/2005 | Oleson | 101/127.1 |
| 2007/0084362 A1 | | 4/2007 | Kim et al. | |

FOREIGN PATENT DOCUMENTS

| | | |
|---|---|---|
| FR | 2 840 851 A1 | 12/2003 |
| JP | 5185580 A | 7/1993 |
| JP | 10-284829 A | 10/1998 |
| JP | 10284829 A | 10/1998 |

OTHER PUBLICATIONS

Extended European Search Report dated Jul. 26, 2010; Application No. / Patent No. 07767770.6-2304 / 2033780 PCT/JP2007062976.
International Search Report for PCT/JP2007/062976 dated: Jul. 12, 2007.
Microfilm of the specification and drawings annexed to the request of Japanese Utility Model Application No. 158029/1987 (Laid-Open No. 63169/1989).

* cited by examiner

*Primary Examiner* — Anthony Nguyen
(74) *Attorney, Agent, or Firm* — Studebaker & Brackett PC; Donald R. Studebaker

(57) ABSTRACT

A printing device capable of improving the printing accuracy by preventing positional displacement of a stencil applies paste on a stencil onto a substrate by spreading the paste by sliding a squeegee along a surface of the stencil disposed on the substrate. Outer attracting means for holding the stencil by attracting an undersurface side thereof is provided on the outside of a squeegee sliding region in which the squeegee slides over the stencil.

3 Claims, 9 Drawing Sheets

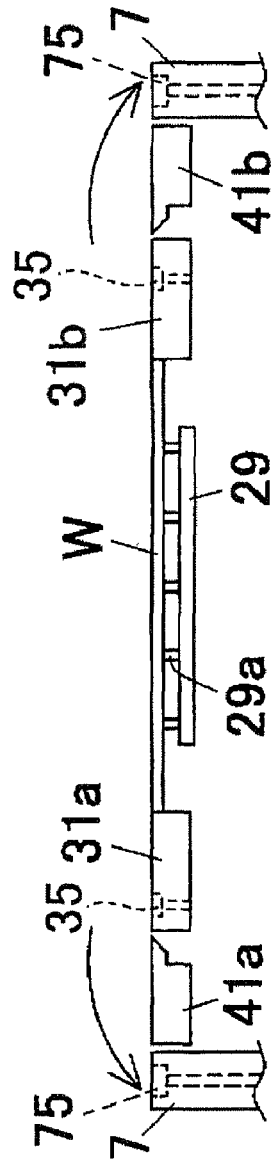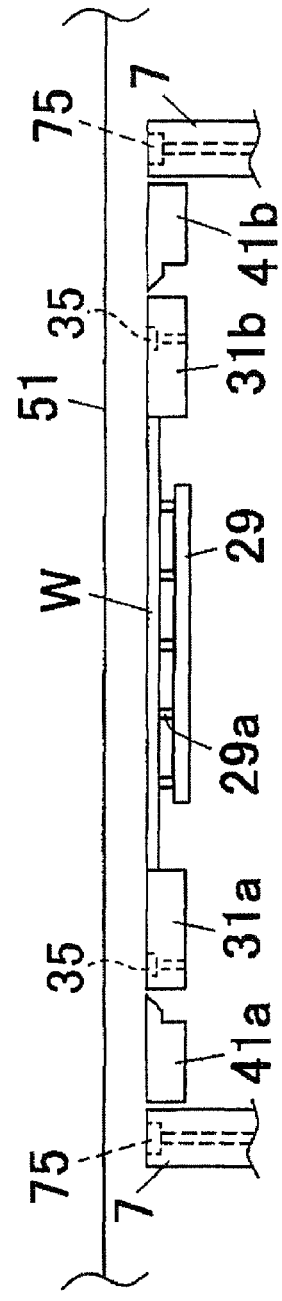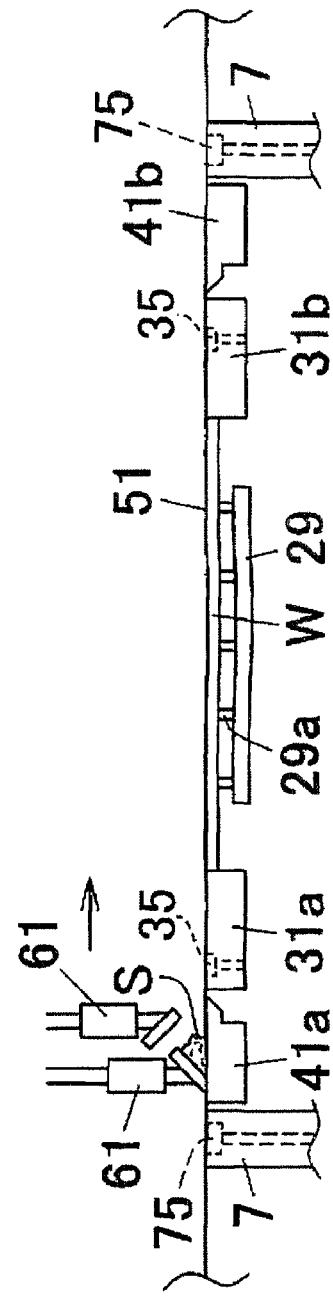

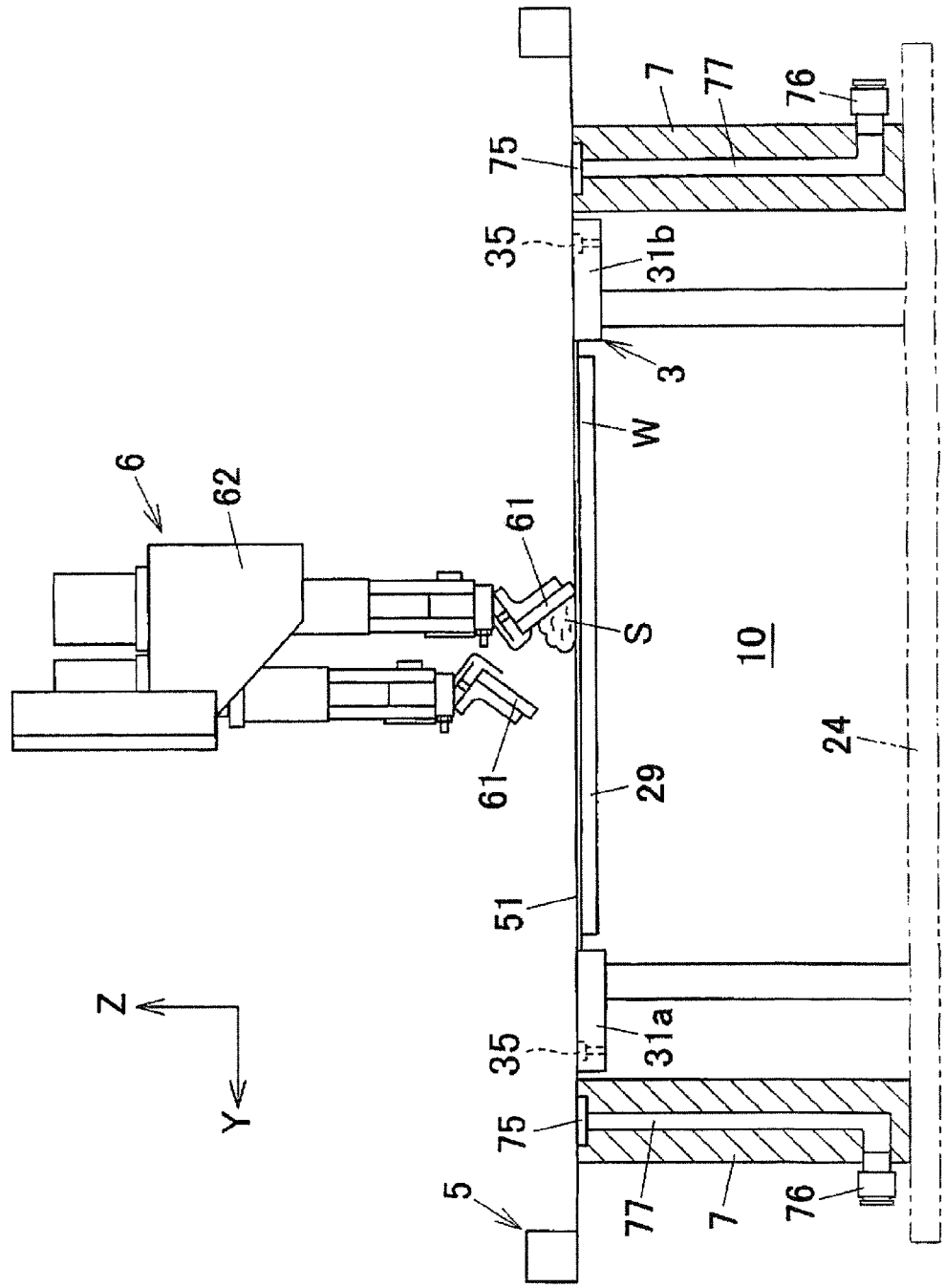

PRINTING DEVICE AND PRINTING METHOD

TECHNICAL FIELD

The present invention relates to a printing device and a printing method for printing paste, such as cream solder, onto a substrate.

BACKGROUND ART

There is a screen printing device configured in such a manner that a stencil (mask) for screen printing is superimposed on a substrate and paste, such as cream solder, supplied on the stencil is spread by sliding the squeegee along the surface of the stencil, so that the cream solder is printed (applied) onto the substrate at predetermined positions via openings (pattern holes) made in the stencil.

In the printing device configured as above, when the squeegee is slid over the stencil, the position of the stencil may possibly be displaced due to frictional resistance associated with the sliding.

In a screen printing device disclosed in Patent Document 1, suction holes are provided to the surfaces of clamps that hold a substrate from the both sides and the stencil is fixed by attracting the stencil to the clamps by setting the suction holes to a negative pressure at the time of printing. It thus becomes possible to prevent positional displacement of the stencil.

In the printing device disclosed in Patent Document 1, however, attracted portions of the stencil are deformed due to a negative pressure and hollows are formed therein. When the squeegee passes over these hollows, part of cream solder scraped up on the front side (scraping face side) of the squeegee goes round to the rear side of the squeegee via the hollows. The squeegee then moves over the stencil while trailing the cream solder present on the rear side. When the cream solder migrates by being trailed by the squeegee in this manner, thread-like cream solder adheres onto the stencil. This causes the cream solder to be applied exceedingly or insufficiently and poses a problem that the printing accuracy is deteriorated.

It should be appreciated, however, that even with the configuration of Patent Document 1, in a case where a sucking force by the clamps is reduced, no hollows will be formed in the stencil due to a negative pressure. Hence, even when the squeegee passes over the attracted portions, it is possible to prevent cream solder from going round to the rear side.

Reducing a sucking force, however, deteriorates a holding force for the stencil. Accordingly, when the squeegee is slid over the stencil, the position of the stencil is displaced due to sliding resistance. It is therefore impossible to solve the initial problem that poor printing occurs.

Patent Document 1: Japanese Patent Unexamined Publication No. HEI5-185580 (Columns 4 and 5 and FIGS. 1 and 2)

DISCLOSURE OF THE INVENTION

The invention was devised in view of the problems discussed above and has an object to provide a printing device and a printing method capable of improving printing accuracy while preventing positional displacement of the stencil.

The above and other technical objects can be achieved by a printing device and a printing method of the invention configured as follows.

That is to say, a printing device of the invention is a printing device that applies paste on a stencil onto a substrate by spreading the paste by sliding a squeegee along a surface of the stencil disposed on the substrate. The printing device is characterized by including outer attracting means, provided on an outside of a squeegee sliding region in which the squeegee slides over the stencil, for holding the stencil by attracting an undersurface side thereof.

Also, a printing method of the invention is characterized by including preparing a stencil to be disposed on a substrate, a squeegee slidable along a surface of the stencil, and outer attracting means disposed on an outside of a squeegee sliding region in which the squeegee slides over the stencil, and applying paste on the stencil onto the substrate by spreading the paste by sliding the squeegee along the surface of the stencil while the stencil is held by attracting an undersurface side thereof using the outer attracting means.

BRIEF DESCRIPTION OF THE DRAWINGS

FIG. 6A is a side view when a substrate is carried in,

FIG. 7A is a side view when the positioning plates are at the evacuation position, FIG. 7B is a side view when an elevating table is ascending, and FIG. 7C is a side view when solder is being spread, all of which are views used to describe operations of the printing device.

FIG. 9 is a side view showing the periphery of the substrate supporting unit in the printing device of the second embodiment.

BEST MODE FOR CARRYING OUT THE INVENTION

First Embodiment

Figure 1:
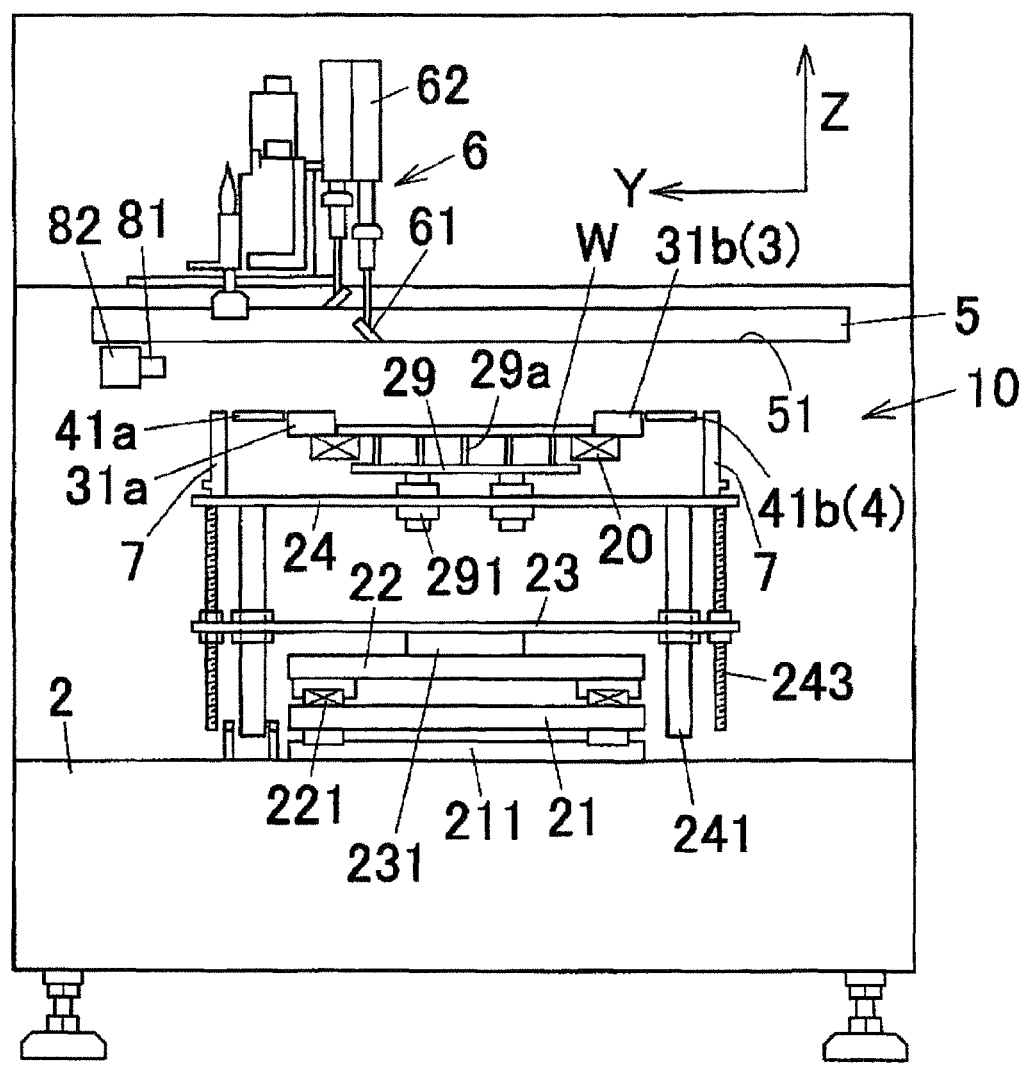
FIG. 1 is a side view of a printing device according to a first embodiment of the invention.
Figure 2:
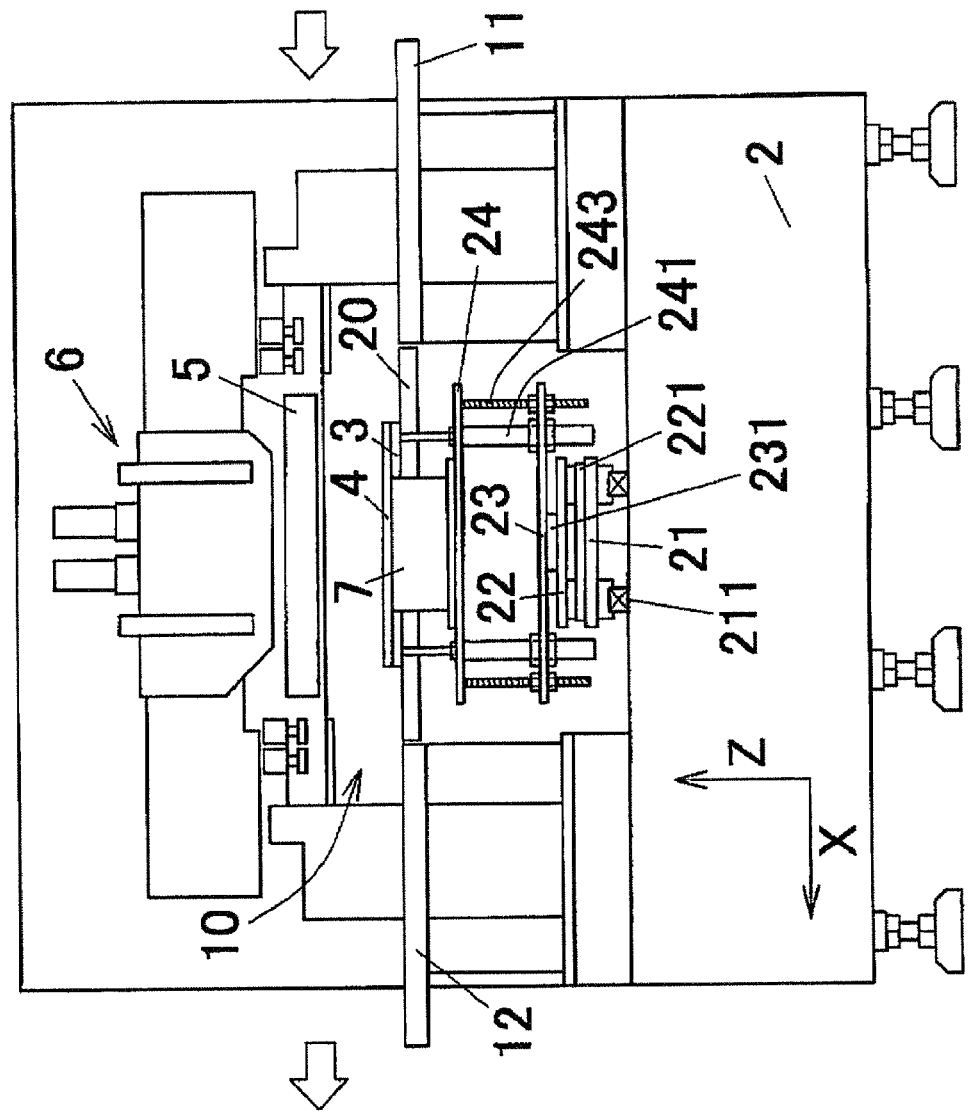
FIG. 2 is a front view showing the printing device.
Figure 3:
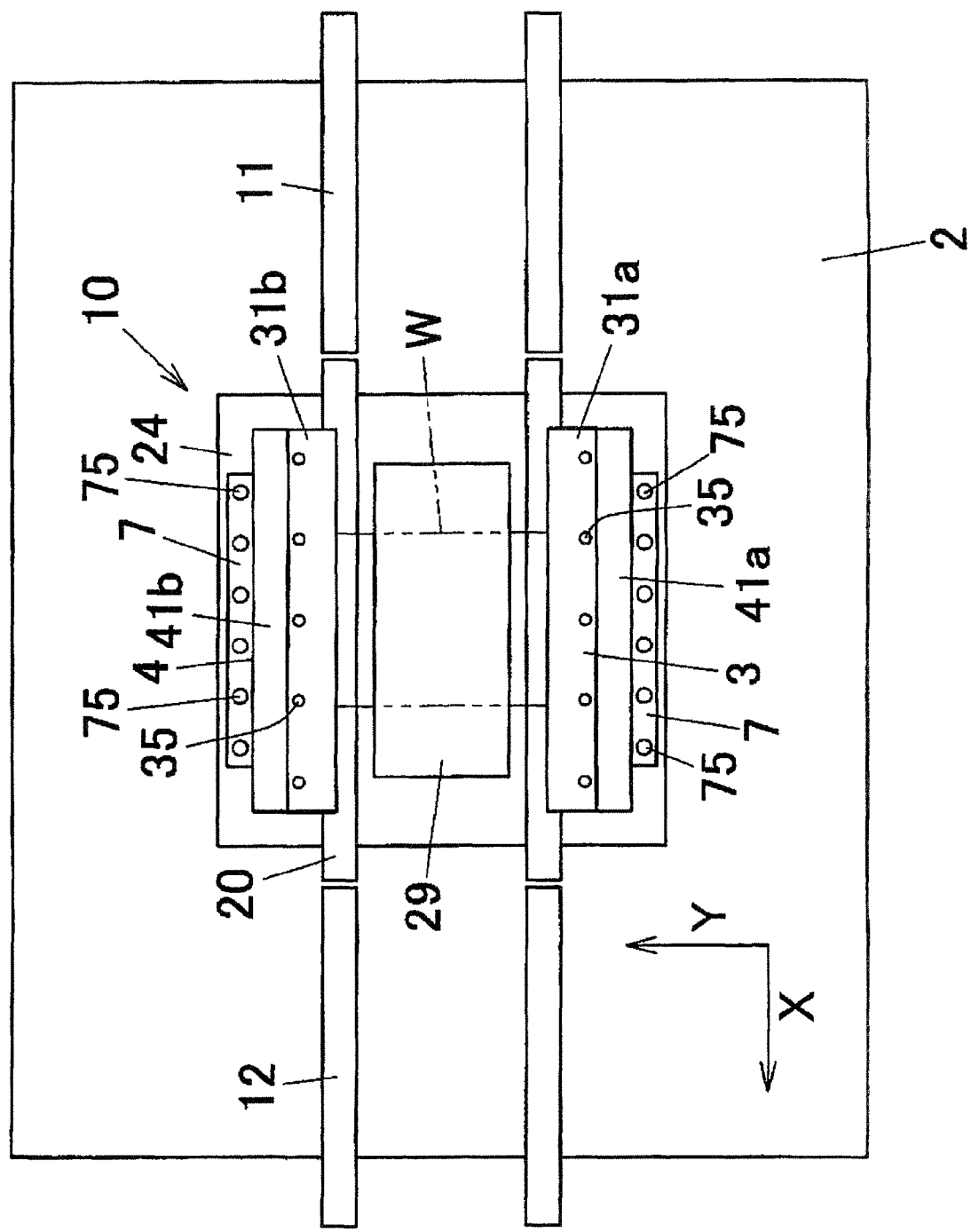
FIG. 3 is a plan view schematically showing the printing device.

FIG. 1 is a side view of a screen printing device according to a first embodiment of the invention. FIG. 2 is a front view of the device and FIG. 3 is a plan view of the device. As are shown in these drawings, the screen printing device includes a substrate supporting unit 10 provided on a base stand 2, an upstream conveyer 11 and a downstream conveyer 12 provided on the both sides in an X axis direction (substrate transportation direction) with the substrate supporting unit 10 in between to carry a printed substrate W in and out from the substrate supporting unit 10, a stencil holding unit 5 and a squeegee unit 6 provided above the substrate supporting unit 10, and a pair of attracting blocks 7 and 7 to attract a stencil

51. As will be described below, the substrate W supported on the substrate supporting unit 10 is superimposed on the stencil 51 in the stencil holding unit 5, and screen printing is performed by squeegees 61 in the squeegee unit 6 in this state.

The substrate supporting unit 10 includes a pair of main conveyers 20 and 20 to carry in and out a printed substrate W, a substrate placing table 29 to support the substrate W via backup pins 29a, a clamp unit 3 to clamp the substrate W, and a positioning unit 4 to position the substrate W by abutting on the top surface thereof when the clamp unit 3 clamps the substrate W.

The substrate supporting unit 10 is supported on the base stand 2 to be movable in the X axis direction, a Y axis direction (a direction orthogonal to the X axis direction within a horizontal plane), a Z axis direction (a top-bottom direction) and an R axis direction (a rotation direction about the Z axis), and configured to be driven in the respective directions defined as above by a moving mechanism described below.

The moving mechanism of the substrate holding unit 10 will be described. Rails 211 are provided on the base stand 2 along the Y axis direction and a Y axis table 21 is attached to the rails 211 to be slidable in the Y axis direction. Further, a ball screw mechanism (not shown) is provided between the Y axis table 21 and the base stand 2. It is configured in such a manner that the Y axis table 21 moves in the Y axis direction with respect to the base stand 2 as the ball screw mechanism is driven to rotate.

Rails 221 are provided on the Y axis table 21 along the X axis direction, and an X axis table 22 is attached to the rails 221 to be slidable in the X axis direction. Further, a ball screw mechanism (not shown) is provided between the X axis table 22 and the Y axis table 21. It is configured in such a manner that the X axis table 22 moves in the X axis direction with respect to the Y axis table 21 as the ball screw mechanism is driven to rotate.

An R axis table 23 rotatable about the shaft center in the Z axis direction is provided to the X axis table 22 via a rotation unit 231. The R axis table 23 is configured to be driven to rotate about the Z axis by unillustrated rotational driving means.

Slide supporting columns 241 are attached to the R axis table 23 at four corners to be slidable along the top-bottom direction (Z axis direction) and an elevating table 24 is attached to the top portions of the slid supporting columns 241. The elevating table 24 is attached to be ascendible and descendible in the Z axis direction with respect to the R axis table 23 by the sliding of the slide supporting columns 241. Further, a ball screw mechanism 243 is provided between the elevating table 24 and the R axis table 23. It is configured in such a manner that the elevating table 24 moves in the Z axis direction (top-bottom direction) with respect to the R axis table 23 as the ball screw mechanism 243 is driven to rotate.

A pair of the main conveyers 20 and 20 is provided above the elevating table 24 along the X axis direction. While the elevating table 24 is in a descent state, the main conveyers 20 are disposed in such a manner that the upstream end portion and the downstream end portion oppose an end portion of the upstream conveyer 11 and an end portion of the downstream conveyer 12, respectively. In the opposing state as above. clearances between the main conveyers 20 and the conveyers and 12 on the both sides are set to an interval small enough for the substrate W to be transferred from one conveyer to another. To be more concrete, the clearances are set as small as about 5 mm. Accordingly, in this embodiment, in order to avoid interference with the conveyers 11 and 12 on the both sides, movements of the main conveyers 20 in a descent state are limited in the X axis and R axis directions caused by the movements of the X axis and R axis tables 22 and 23, respectively. Also, in order to prevent positional displacement with respect to the conveyers 11 and 12 on the both sides, movements of the main conveyers 20 are limited in the Y axis and R axis directions caused by movements by the Y axis and R axis tables 21 and 23, respectively. In other words, movements of the main conveyers 20 in the descent state are limited in the horizontal directions (X axis, Y axis, and R axis directions) caused by movements of the X axis, Y axis, and R axis tables 21 through 23.

Figure 4:
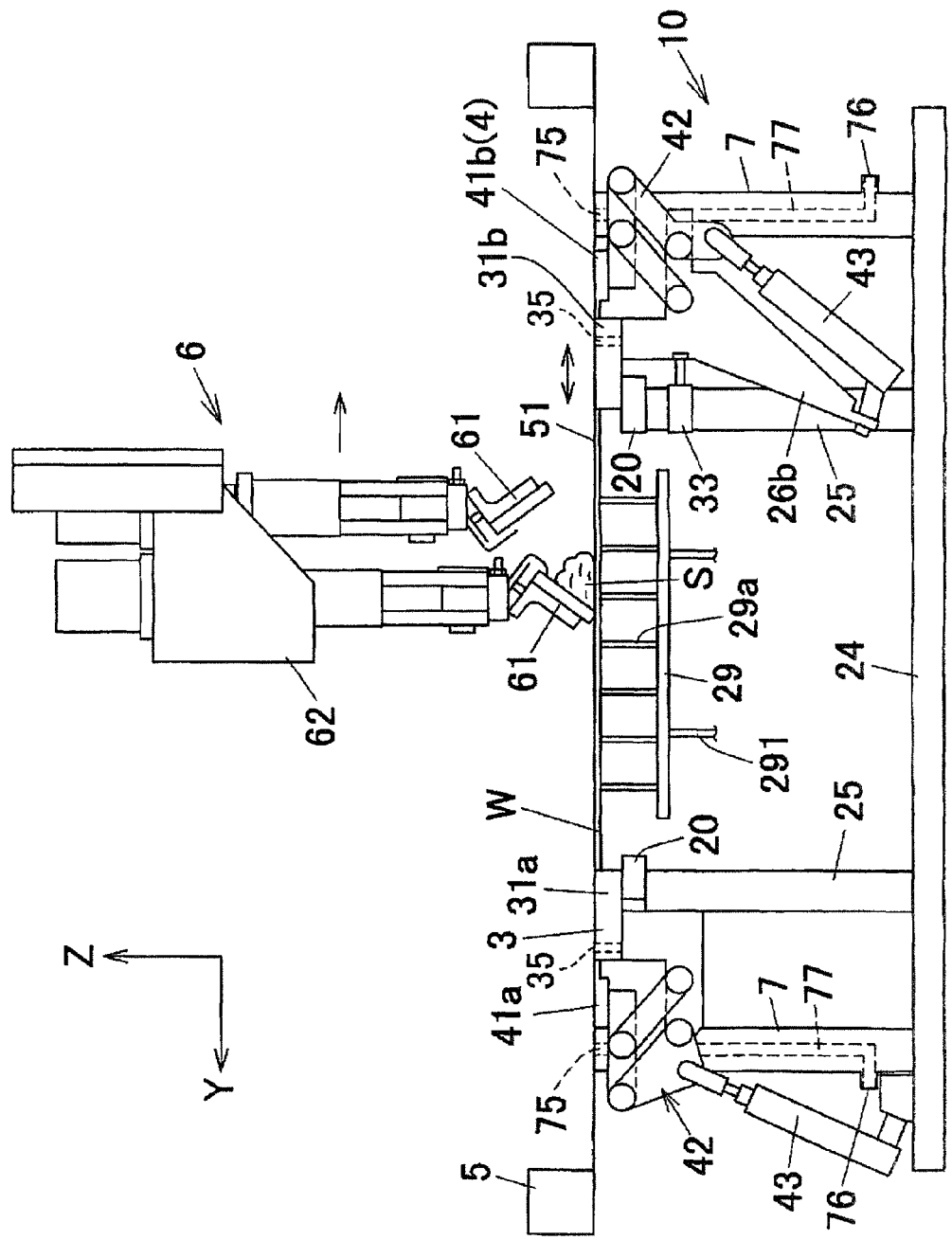
FIG. 4 is a side view showing the periphery of a substrate supporting unit in the printing device.

As are shown in FIGS. 1 through 4, the substrate placing table 29 is disposed between a pair of the main conveyers 20 and 20. The substrate placing table 29 is provided to the elevating table 24 via the slide supporting columns 291 to be ascendible and descendible in the top-bottom direction. Further, a ball screw mechanism (not shown) is provided between the substrate placing table 29 and the elevating table 24. It is configured in such a manner that the substrate placing table 29 moves in the top-bottom direction with respect to the elevating table 24 as the ball screw mechanism is driven to rotate. As is shown in FIG. 4, plural backup pins 29a to support the substrate W are provided on the substrate placing table 29. It is configured in such a manner that the substrate W on the main conveyers 20 is pushed up by the backup pins 29a and moves upward together with the substrate placing table 29as the substrate placing table 29 ascends while the substrate W is disposed on the main conveyers 20, whereas the substrate W on the backup pins 29a is returned to the initial position on the main conveyers 20 as the substrate placing table 29descends while the substrate W is disposed on the backup pins 29a.

As are shown in FIGS. 1 through 4, the clamp unit 3 is provided to the elevating table 24. The clamp unit 3 includes a pair of belt-shaped clamp plates 31a and 31b disposed on the upper sides of a pair of the main conveyers 20 and 20 along the X axis direction. The clamp plate 31a on one side is fixed to a structural material 25 (see FIG. 4) of the elevating table 24, whereas the clamp plate 31b on the other side is attached to another structural material 25 of the elevating table 24to be slidable in the Y axis direction and configured to be movable so that it can come close to and move away from the clamp plate 31a on one side.

Further, a bracket 26b is provided to the clamp plate 31b on the other side and an air cylinder 33 is provided between the bracket 26b and the corresponding structural member 25. It is configured in such a manner that when the cylinder 33 is driven to advance (driven to extend), the clamp plate 31b on the other side moves in a direction to move away from the clamp plate 31a on one side along the Y axis direction so that an interval between the respective clamp plates 31a and 31b becomes wider, and when the cylinder 33 is driven to retreat (driven to contract), the clamp plate 31b on the other side moves in a direction to come closer to the clamp plate 31a on one side along the Y axis direction so that the interval between the respective clamp plates 31a and 31b becomes narrower. As will be described below, the substrate W is held and released by opening and closing a pair of the clamp plates 31a and 31b in this manner.

As are shown in FIGS. 3 and 4, plural suction holes 35 are provided to the top surfaces of the both clamp plates 31a and 31b. It is configured in such a manner that each suction hole 35 is set to a negative pressure by unillustrated suction means. As will be described below, it is configured in such a manner that the stencil 51 is held by attraction onto the top surfaces of the clamp plates 31a and 31b by setting the respective suction holes 35 to a negative pressure while the stencil 51 is superimposed on the clamp plates 31a and 31b. In this embodiment, the suction holes 35 form the clamp side attracting means.

Figure 5A:
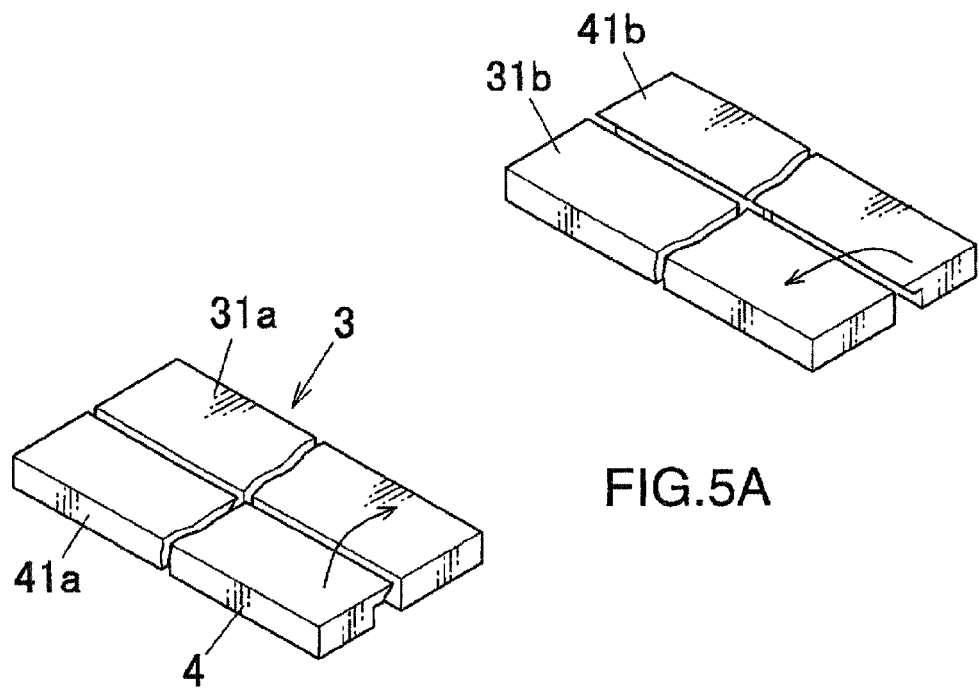
FIG. 5A is a perspective view when positioning plates are at an evacuation position and FIG. 5B is a perspective view when the positioning plates have advanced to a positioning position, both of which are views used to describe the positional relation of the positioning plates with respect to clamps in the printing device.
Figure 5B:
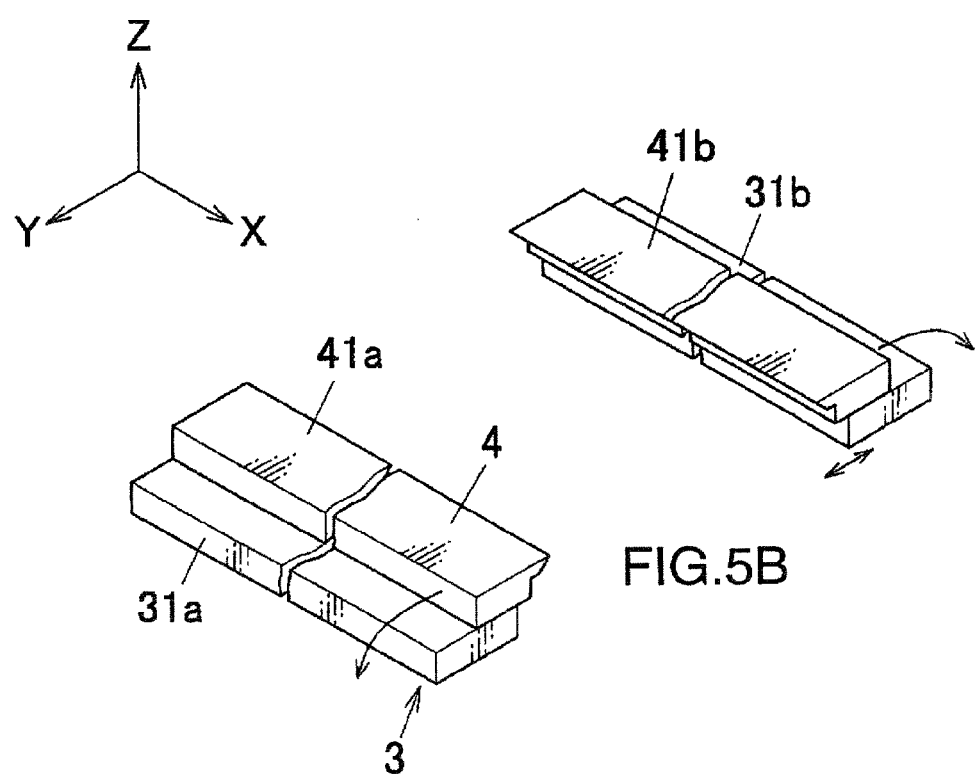

As is shown in FIGS. 3 and 4, the positioning unit 4 is provided to the elevating table 24. The positioning unit 4 includes a pair of belt-shaped positioning plates 41a and 41b disposed correspondingly to the clamp plates 31a and 31b, respectively. The positioning plate 41a on one side is provided to the corresponding structural material 25 via a parallel link mechanism 42, whereas the positioning plate 41b on the other side is provided to the bracket 26b via another parallel link mechanism 42. It is configured in such a manner that the both positioning plates 41a and 41b are allowed to undergo displacement between an evacuation position at which they are disposed on the both sides of a pair of the clamp plates 31a and 31b as is shown in FIG. 5A and a positioning position at which they are disposed on the upper side of a pair of the clamp plates 31a and 31b as is shown in FIG. 5B in association with rotations of the parallel link mechanisms 42 and 42 while keeping a horizontal posture. Further, the both positioning plates 41a and 41b are disposed at the evacuation position in such a manner that the top surfaces are within a same horizontal plane with respect to the top surfaces of a pair of the clamp plates 31a and 31b, whereas they are disposed at the positioning position in such a manner that parts of the lower end faces protrude in the Y axis direction to the inside of a pair of the clamp plates 31a and 31b.

Also, cylinders 43 to drive the corresponding parallel link mechanisms 42 are provided to the elevating table 24 and the bracket 26b. It is configured in such a manner that a pair of the positioning plates 41a and 41b advances inward and moves to the positioning position as the cylinders 43 are driven to advance (driven to extend), whereas a pair of the positioning plates 41a and 41b moves in a direction to move apart from each other and move backward to the evacuation position as the cylinders 43 are driven to retreat (driven to contract).

As are shown in FIGS. 3 and 4, a pair of attracting blocks 7 and 7 as outer attracting means is provided on the elevating table 24. The attracting blocks 7 and 7 are disposed on the further outside of a pair of the positioning plates 41a and 41b in an evacuation state and fixed to the elevating table 24. Although it will be described in detail below, the attracting blocks 7 and 7 are disposed on the outside of a sliding region for the squeegees 61 over the stencil 51.

Also, the both attracting blocks 7 and 7 are provided in such a manner that the both top surfaces are disposed within a same plane with respect to the top surfaces of the clamp plates 41a and 41b and the top surfaces of the positioning plates 41a and 41b in the evacuation state.

Plural suction holes 75 are provided to the top surfaces of the attracting blocks 7 and 7, and suction means coupling openings 76 are provided to the outer surfaces at the bottom portions of the attracting blocks 7 and 7. Further, suction paths 77 to bring the suction holes 75 and the suction means coupling openings 76 into communication are provided inside the attracting blocks 7 and 7. It is configured in such a manner that unillustrated suction means is coupled to the suction means coupling openings 76 and the suction holes 75 are set to a negative pressure by the suction means via the suction means coupling openings 76 and the suction paths 77. As will be described below, it is configured in such a manner that the stencil 51 is held by attraction onto the top surfaces of the attracting blocks 7 and 7 by setting the respective suction holes 75 to a negative pressure while the stencil 51 is superimposed on the attracting blocks 7 and 7.

As are shown in FIGS. 1 and 2, it is configured in such a manner that the stencil holding unit 5 provided above the substrate supporting unit 10 is able to hold the stencil 51 having openings (pattern holes) in a solder applied portion in a state stretched in the horizontal direction.

The squeegee unit 6 provided on the upper side of the stencil holding unit 5 has a squeegee holder 62 movable along the Y axis direction, and a pair of squeegees 61 and 61 is provided to the squeegee holder 62 to be individually ascendible and descendible. It is configured in such a manner that cream solder S is spread with rolling (kneading) on the stencil 51 toward one side in the Y axis direction by moving one squeegee 61 in a descent state to one side in the Y axis direction, while cream solder S is spread with rolling on the stencil 51 to the other side in the Y axis direction by moving the other squeegee 61 in a descent state to the other side in the Y axis direction.

Operations of the screen printing device configured as above will now be described. In an initial state, both the elevating table 24 and the substrate placing table 29 are in a descent state and the main conveyers 20 are disposed between the upstream conveyer 11 and the downstream conveyer 12. Further, the clamp plates 31a and 31b are in an open state and the positioning plates 41a and 41b are in an evacuation state.

Figure 6A:
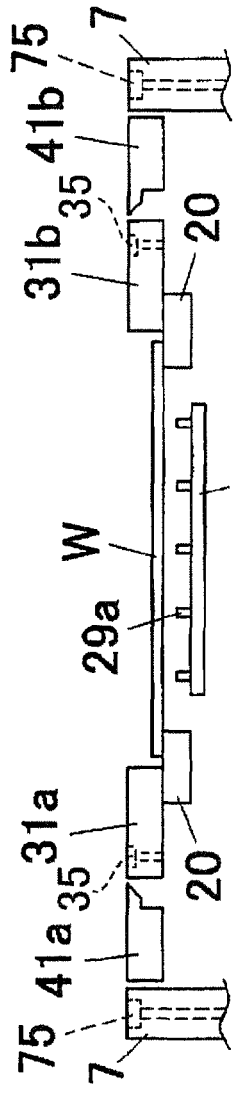

In this state, a printed substrate W is carried in onto the main conveyers 20 from the upstream conveyer 11, and as is shown in FIG. 6A, the substrate W is transported to a predetermined position on the main conveyers 20.

Figure 6B:
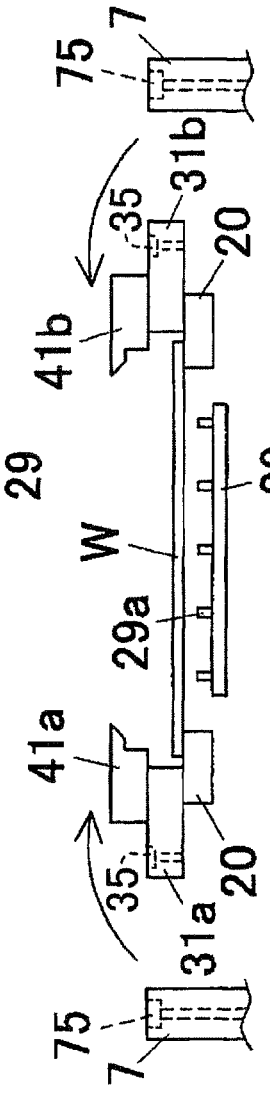
FIG. 6B is a side view when the positioning plates have advanced to the positioning position.
Figure 6C:
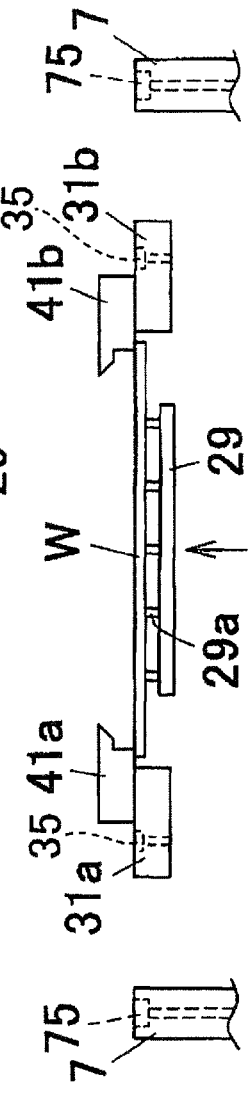
FIG. 6C is a side view when the substrate is ascending.
Figure 6D:
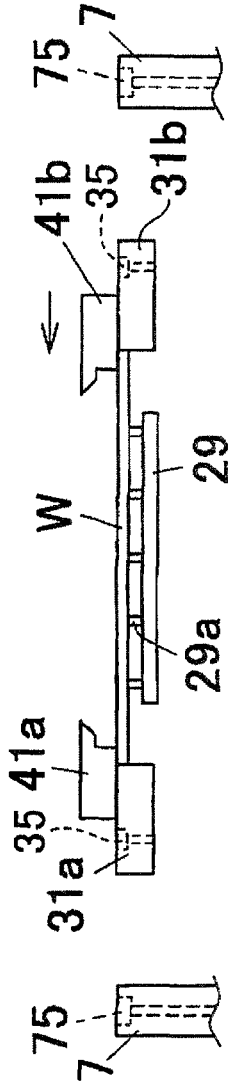
FIG. 6D is s side view when the substrate is clamped, all of which are views used to describe operations of the printing device.

Subsequently, as is shown in FIG. 6B, the positioning plates 41a and 41b in the positioning unit 4 move inward and are disposed at the positioning position, after which, as is shown in FIG. 6C, the substrate placing table 29 ascends. Accordingly, the substrate W is transferred onto the backup pins 29a of the substrate placing table 29 from the main conveyers 20. The substrate placing table 29 ascends further, and as is shown in FIG. 6D, the clamp plates 31a and 31b are closed when the top surface of the substrate W abuts on the undersurfaces of the positioning plates 41a and 41b and is disposed within a same plane with respect to the top surfaces of the clamp plates 31a and 31b. The substrate W is thus pinched and thereby held by the clamp plates 31a and 31b.

Subsequently, as is shown in FIG. 7A, the positioning plates 41a and 41b move outward and are disposed at the evacuation position. In this instance, the top surface of the substrate W, the top surfaces of the clamp plates 31a and 31b, the top surfaces of the positioning plates 41a and 41b, and the top surfaces of the attracting blocks 7 and 7 are all disposed within a same plane.

In this embodiment, as is shown in FIG. 1, a camera 81 movable in the horizontal direction and a cleaner 82 movable in the Y axis direction are provided between the substrate supporting unit 10 in a descent state and the stencil holding unit 5. It is configured in such a manner that the location and the type (part number) of the substrate W and the location and the type of the stencil 51 are identified by the camera 81, and fine-tuning (correction) of the position resulting from individual differences is performed on the basis of the identification information as will be described below. Further, it is configured in such a manner that the stencil 51 is cleaned by the cleaner 82 each time a predetermined number of substrates W are processed.

Subsequently, as is shown in FIG. 7B, when the elevating table 24 ascends slightly and the main conveyers 20 protrude upward from the conveyers 11 and 12 on the both sides, the Y axis table 21, the X axis table 22, and the R axis table 23 are moved, respectively, in the Y axis, X axis, and R axis directions as needed, so that the position of the substrate W in a horizontal direction with respect to the stencil 51 is adjusted.

When the position is adjusted as above, as is shown in FIG. 7C, the elevating table 24 ascends and the respective top surfaces of the substrate W, the clamp plates 31a and 31b, the positioning plates 41a and 41b, and the attracting blocks 7 and 7 are superimposed on the undersurface of the stencil 51 in the stencil holding unit 5. Subsequently, the suction holes 35 in the clamp plates 31a and 31b and the suction holes 75 in the attracting blocks 7 and 7 are set to a negative pressure, so that the stencil 51 is fixed by attraction onto the respective top surfaces of the clamp plates 31a and 31b and the attracting blocks 7 and 7.

Subsequently, the cream solder S as the paste supplied on the stencil 51 is spread as the squeegee 61 on one side in the squeegee unit 6 descends and moves in the Y axis direction along the stencil 51. The cream solder S is thus printed (applied) onto the substrate W at predetermined positions via pattern holes in the stencil 51.

In this embodiment, in order to print the solder S, the squeegee 61 on one side runs up in a region (a run-up region on one side) on the stencil 51 corresponding to the positioning plate 41a on one side and the clamp plate 31a on one side first, and thence slides in a region (printing region) on the stencil 51 corresponding a region above the substrate W. Accordingly, the cream solder S can be rolled (kneaded) to reduce a viscosity in the run-up region before the cream solder S is printed onto the substrate W. It thus becomes possible to print the cream solder S onto the substrate W at a high degree of accuracy by filling the pattern holes in the stencil 51 with the cream solder S in a reliable manner.

In this embodiment, it should be noted, in particular, that a region above the positioning plate 41a is used as the run-up region in addition to the region above the clamp plate 31a. Hence, not only is it possible to ensure a sufficiently long run-up region, but it is also possible to print the solder S onto the substrate W at a higher degree of accuracy by kneading the cream solder S sufficiently before the printing.

In a case where the cream solder S is scraped by the squeegee 61 on the other side, too, the squeegee 61 on the other side runs up a region (a run-up region on the other side) corresponding to the positioning plate 41b on the other side and the clamp plate 31b on the other side first, and thence slides in a region (printing region) corresponding to a region above the substrate W. Hence, as with the case above, it is possible to print the cream solder S at a high degree of accuracy by kneading the cream solder S sufficiently.

Also, in this embodiment, the stencil 51 is held by attraction using both the suction holes 35 in the clamp plates 31a and 31b and the suction holes 75 in the attracting blocks 7 and 7. It is therefore possible to obtain a sufficient attracting force and the stencil 51 can be fixed in a reliable manner. It thus becomes possible to prevent, in a reliable manner, positional displacement of the stencil 51 because of sliding resistance when the squeegees 61 slide over the stencil 51. The printing accuracy can be therefore improved effectively.

After the cream solder S is applied onto the substrate W in this manner, the elevating table 24 descends slightly and the substrate W is released (plate releasing) from the stencil 51. Thereafter, the Y axis table 21, the X axis table 22, and the R axis table 23 move in the X, Y, and R axis directions as needed, and the horizontal position of the substrate W is returned to the initial position.

Subsequently, the clamp plates 31a and 31b are opened at the same time when the elevating table 24 descends, and the substrate W is released from the holding state. The substrate placing table 29 descends while the elevating table 24 is descending to the initial descent position. The substrate W being placed on the backup pins 29a of the substrate placing table 29 is then transferred onto the main conveyers 20.

Subsequently, the substrate W is transported to the downstream conveyer 12 by the main conveyers 20 and sent out to the following process via the downstream conveyer 12.

While the substrate W is carried out onto the downstream conveyer 12, the following substrate W is transported onto the main conveyers 20 by the upstream conveyer 11, and the printing processing is performed in the same manner as above. Printing processing is performed successively for one substrate W to another by repeating the operations described above.

This embodiment uses the squeegee 61 on one side and the squeegee 61 on the other side alternately for each substrate W subject to printing processing. In other words, printing processing by a movement in one direction by which solder S is applied onto the substrate W by sliding the squeegee 61 on one side from the run-up region on one side (above the positioning plate 41a and clamp plate 31a on one side) toward the printing region, and printing processing by a movement in the other direction by which the solder S is applied onto the substrate W by sliding the squeegee 61 on the other side from the run-up region on the other side (above the positioning plate 41b and clamp plate 31b on the other side) toward the printing region, are performed alternately for each substrate W to be processed.

In this embodiment, the squeegee sliding region is made up of the printing region and the run-up regions.

As has been described, according to the printing device of this embodiment, the attracting blocks 7 and 7 are disposed on the outside of the squeegee sliding region and the both side portions of the stencil 51 are held by attraction using the suction holes 75 in the attracting blocks 7 and 7. Hence, should the stencil 51 be deformed due to a negative pressure in the suction holes 75 and hollows be formed, the squeegees 61 and 61 will never pass over the hollows. It is therefore possible to prevent, in a reliable manner, an inconvenience, such as an event that the cream solder S goes round to the squeegee rear surface and thread-like cream solder adheres onto the stencil because the squeegees 61 and 61 have passed over the hollows. The quality of the printed substrate can be thus improved by ensuring a high degree of printing accuracy.

Further, in this embodiment, the suction holes 35 are also provided to the clamp plates 31a and 31b and the stencil 51 is held by attraction using the suction holes 35. It is therefore possible to hold the stencil 51 by attraction in a wide range using the clamp plates 31a and 31b and the attracting blocks 7 and 7. Consequently, because the stencil 51 can be maintained in a more stable state, an inconvenience, such as positional displacement of the stencil 51 caused by sliding resistance of the squeegees 61, can be prevent in a more reliable manner. The printing accuracy can be thus improved further.

As has been described, in this embodiment, the attracting force of the attracting blocks 7 and 7 disposed on the outside of the squeegee sliding region can be sufficiently large. It is therefore unnecessary to set a sucking force of the suction holes 35 in the clamp plates 31a and 31b to a larger force than is necessary. Accordingly, formation of hollows caused by deformation of the attracted portion in the stencil 51 by the suction holes 35 can be prevented, and the entire squeegee sliding region including the attracted portions can be maintained as a flat plane. It is therefore possible to prevent, in a reliable manner, an inconvenience caused when the squeegees 61 pass over the hollows, the inconvenience, for example, trailing of the cream solder S that went round to the rear side of the squeegees 61 via the hollows. A high degree of printing accuracy can be thus maintained in a reliable manner.

Further, because a negative pressure in the suction holes 35 on the clamp plate 31a and 31b can be smaller, the negative pressure does not give influences between the substrate W and the stencil 51. It is therefore possible to prevent, in a reliable manner, an inconvenience that the cream solder S seeps into a space between the stencil 51 and the substrate W because of the influences of the negative pressure. The printing accuracy can be improved further and a higher quality can be achieved.

Also, in this embodiment, the attracting blocks 7 and 7 are disposed to stand on the both sides of the substrate supporting unit 10. Accordingly, the attracting blocks 7 and 7 are able to protect the substrate supporting unit 10, such as the clamp unit 3, the positioning unit 4, and the substrate placing table 29, and the moving mechanism of the substrate supporting unit 10, which can in turn enhance the durability of the printing device per se.

Also, in this embodiment, a pair of the attracting blocks 7 and 7 is fixed to the elevating table 24. The invention, however, is not limited to this configuration, and the attracting blocks 7 and 7 may be attached to be movable in the Y axis direction. More specifically, it is configured in such a manner that one of a pair of the main conveyers 20 and 20 in the substrate supporting unit 10 is formed as a movable side conveyer that is movable in the Y axis direction, so that an interval between a pair of the conveyers 20 and 20 is adjusted according to the size of a substrate W by moving the movable side conveyer 20. Hence, in a case where it is configured in such a manner that one attracting block 7 is allowed to move in association with the movable side conveyer 10 by fixing this attracting block 7 to the movable side conveyer 20, when a substrate W of a different size is to be processed, one attracting block 7 moves in association with the movable side conveyer 20. It thus becomes possible to maintain a constant distance from the attracting block 7 to the substrate W independently of the substrate size. Accordingly, the positional relation of the attracting block 7 and the substrate W can be set always to be constant, and it becomes possible to attract the stencil 51 in a more stable state by making the attracting position neither too far nor too close with respect to the substrate W. The printing accuracy can be thus improved further.

Second Embodiment

Figure 8:
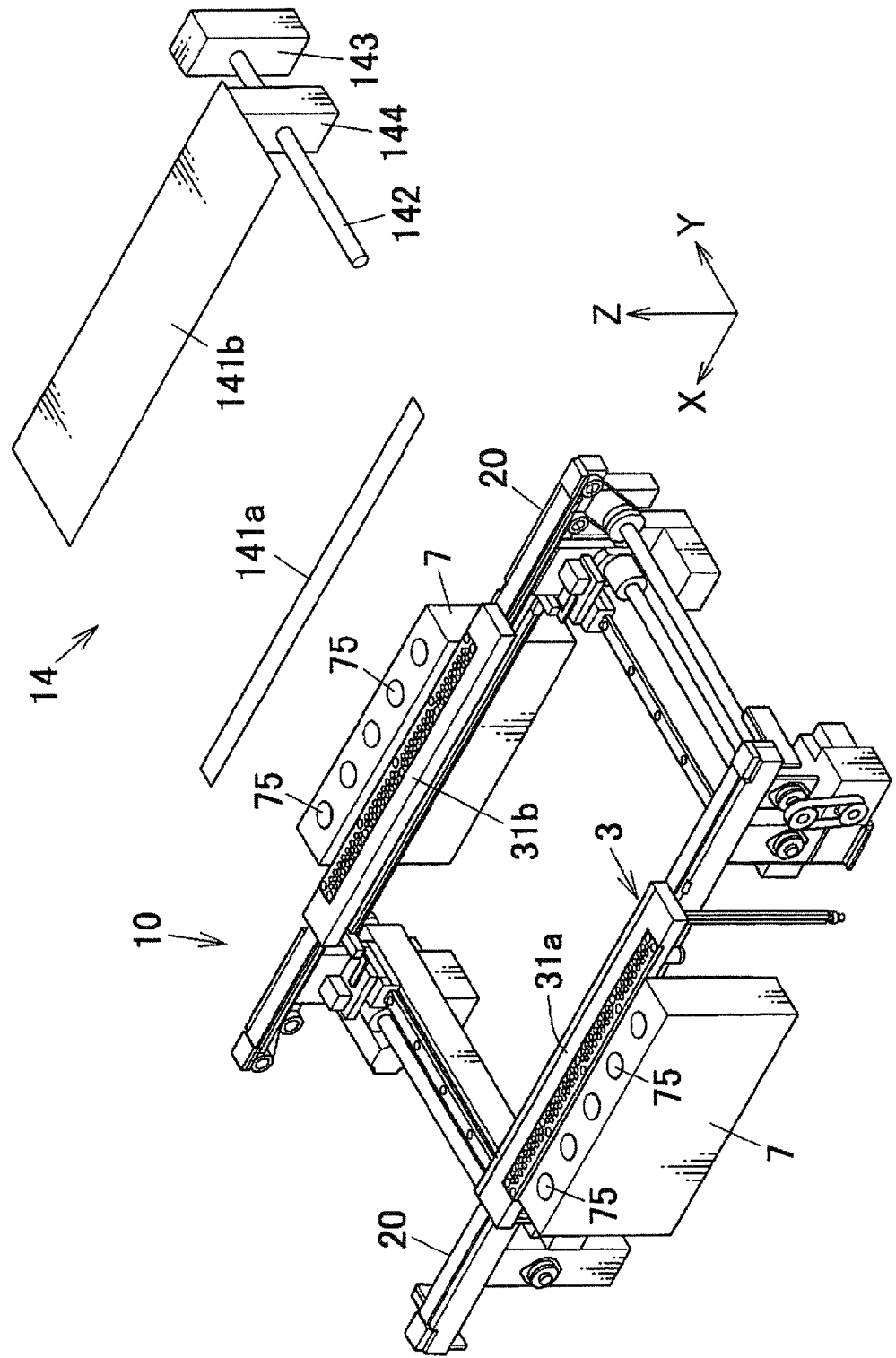
FIG. 8 is a perspective view showing the periphery of a substrate supporting unit in a printing device according to a second embodiment of the invention.

FIGS. 8 and 9 are views showing the periphery of a substrate supporting unit in a screen printing device according to a second embodiment of the invention. As are shown in these drawings, in the printing device of the second embodiment, a positioning unit 14 is not provided to the substrate supporting unit 10 and instead it is provided lateral to the printing position.

It should be appreciated, however, that the substrate supporting unit 10 includes the clamp unit 3, the elevating table 24, the substrate placing table 29, and so forth, in the same manner as the first embodiment, except that the positioning unit is excluded. The substrate supporting unit 10 is configured in such a manner to be movable in the X axis, Y axis, Z axis, and R axis directions on the base stand of the printing device when driven by an unillustrated driving mechanism.

Meanwhile, the positioning unit 14 is disposed at a lateral position spaced apart in the Y axis direction from the printing position. The positioning unit 14 includes an immovable side positioning plate 141a and a movable side positioning plate 141b. Both the positioning plates 141a and 141b are set at the same height and disposed to be parallel to the main conveyers 20 and the clamp plates 31a and 31b.

The immovable side positioning plate 141a is fixed to the base stand of the printing device. Further, the movable side positioning plate 141b is supported on the base stand to be movable in the Y axis direction.

A ball screw 142 extending in the Y axis direction to drive the movable side positioning plate 141b is provided on the base stand. The ball screw 142 is configured to be driven to rotate about the shaft center by ball screw driving means 143 that is coupled to one end of the ball screw 142. Further, a Y axis direction mobile body 144 is threaded into the ball screw 142 and the movable side positioning plate 141b is fixed to the mobile body 144. It is configured in such a manner that when the ball screw 142 is driven to rotate, the movable side positioning plate 141b together with the Y axis direction mobile body 144 moves in a direction (Y axis direction) to come close to or move away from the immovable side positioning plate 141.

The attracting blocks 7 and 7 are disposed on the outside of the clamp plates 31a and 31b and fixed to the elevating table 22. As in the first embodiment above, the attracting blocks 7 and 7 are disposed on the outside of the sliding region for the squeegees 61 and 61 over the stencil 51.

Regarding the other configurations, the printing device of the second embodiment is substantially the same as the printing device of the first embodiment above. Accordingly, same or equivalent members are labeled with same or equivalent reference numerals and the descriptions will not be repeated.

In the printing device of the second embodiment, when a substrate W is carried in onto the main conveyers 20, the substrate supporting unit 10 moves in the Y axis direction to be disposed below the positioning unit 14. Subsequently, the substrate supporting unit 10 starts to ascend and stops when the top surfaces of the clamp plates 31a and 31b abut on the undersurfaces of the positioning plates 141a and 141b.

Subsequently, the substrate placing table 29 ascends and the substrate W is transferred onto the substrate placing table 29 from the main conveyers 20. The substrate placing table 29 ascends further and the clamp plates 31a and 31b are closed when the top surface of the substrate W abuts on the undersurfaces of the positioning plates 141a and 141b and is disposed within a same plane with respect to the top surfaces of the clamp plates 31a and 31b. The substrate W is thus pinched and thereby held by the clamp plates 31a and 31b.

After the substrate W is held by the clamp plates 31a and 31b in this manner, the substrate supporting unit 10 moves to the predetermined printing position by descending and moving along the Y axis direction.

Subsequently, the substrate supporting unit 10 ascends, and as in the first embodiment above, it is superimposed on the undersurface of the stencil 51 while the suction holes 35 in the clamp plates 31a and 31b and the suction holes 75 in the attracting blocks 7 and 7 are set to a negative pressure. The stencil 51 is thus held by attraction.

Thereafter, as in the first embodiment above, the squeegees 61 and 61 slide over the stencil 51 in the sliding region, that is, the squeegees 61 and 61 slide over the region corresponding to a space between the both clamp plates 31a and 31b. The cream solder S is thus spread and printed onto the substrate W.

In this second embodiment, too, as with the case described above, the attracting blocks 7 and 7 are disposed on the outside of the squeegee sliding region and the stencil 51 is held by attraction via the suction holes 75 at this position. Hence, the squeegees 61 and 61 will never pass over the region corresponding to the suction holes 75. It thus becomes possible to prevent, in a reliable manner, an inconvenience, such as an event that the cream solder S goes round to the rear side of the squeegees 61 because the squeegees 61 have passed over such a region. Consequently, the quality of the printed substrate can be enhanced by maintaining a high degree of printing accuracy.

Further, in the second embodiment, too, as in the case described above, the suction holes 35 are made in the clamp plates 31a and 31b. The stencil 51 can be thus held by attraction in a wide range using the suction holes 35 and 75 in both the clamp plates 31a and 31b and the attracting blocks 7 and 7. Consequently, the stencil 51 can be held in a more stable state.

Also, as in the case described above, because the attracting force by the suction holes 75 in the attracting blocks 7 and 7 can be sufficiently large, there is no need to set a sucking force by the suction holes 35 in the clamp plates 31a and 31b to a larger force than is necessary. It is therefore possible to prevent the formation of hollows due to deformation of the attracted portion in the stencil 51 by the suction holes 35, which can prevent an inconvenience resulting from the hollows in a reliable manner.

Meanwhile, after the printing is completed, the substrate supporting unit 10 descends slightly and the substrate W is released from the stencil 51. The clamp plates 31a and 31b are opened at the same time when the substrate supporting unit 10 descends further, and the substrate W is released from the holding state. As the substrate placing table 29 descends while the substrate supporting unit 10 is descending, the substrate W being placed on the substrate placing table 29 is transferred onto the main conveyers 20. The substrate supporting unit 10 and the substrate placing table 29 are then returned to the respective initial positions.

Subsequently, while the substrate W is carried out by the main conveyers 20, the following substrate W is carried in onto the main conveyers 20, and the printing processing is performed in the same manner as above. Substrates are successively sent in and subject to printing processing one by one in this manner.

In the second embodiment, too, it is possible to achieve the same function and effect as those in the first embodiment above. Moreover, because the positioning plates 41a and 41b are not disposed on the outside of the clamp plates 31a and 31b, it is possible to dispose the attracting blocks 7 and 7 in close proximity to the clamp plates 31a and 31b without leaving a clearance. This enables the attracting blocks 7 and 7 to attract the stencil 51 at the position in close proximity to the printing region. Consequently, the stencil 51 can be held in a more stable state.

In the second embodiment, too, as has been described, in a case where it is configured in such a manner that one attracting block 7 corresponding to the movable side main conveyer 20, which is one of a pair of the main conveyers 20 and 20, is allowed to move in association with the movable side conveyer 20, it is possible to hold the substrate W by attraction in a more stable state independently of the size of the substrate W.

The respective embodiments above described, by way of example, the printing devices that superimpose the substrate W placed on the substrate supporting unit 10 on the stencil 51 by controlling the substrate supporting unit 10 to ascend. The invention, however, is not limited to this configuration, and the invention is applicable to a printing device of a type in which the stencil ascends and descends so that the stencil is superimposed on the substrate placed on the substrate supporting unit.

In the embodiments above, the stencil 51 is attracted by setting the suction holes 35 and 75 made in the clamp plates 31a and 31b and the attracting blocks 7 and 7 to a negative pressure. The attracting means of the invention is not limited to this configuration, and other attracting means, for example, electromagnets for attracting the stencil 51, is also applicable.

As has been described on the basis of the embodiments above, a printing device of the invention is a printing device that applies paste on a stencil onto a substrate by spreading the paste by sliding a squeegee along a surface of the stencil disposed on the substrate. The printing device is characterized by including outer attracting means, provided on an outside of a squeegee sliding region in which the squeegee slides over the stencil, for holding the stencil by attracting an undersurface side thereof.

According to this printing device, because the outer attracting means is provided on the outside of the squeegee sliding region, the squeegee will never pass over portions attracted by the outer attracting means. An inconvenience caused by such passing of the squeegee can be therefore prevented in a reliable manner. Hence, because the stencil can be held by the outer attracting means with a sufficient attracting force, not only can positional displacement of the stencil be prevented, but also the printing accuracy can be improved.

It is preferable that an attracting block is disposed on an outside of the squeegee sliding region, and the outer attracting means is provided to a top surface of the attracting block.

According to this configuration, it is possible to protect the mechanisms on the periphery of the substrate by the attracting block.

It is preferable to provide a pair of clamp plates to hold the substrate by pinching the substrate from both sides, and clamp side attracting means, provided to top surfaces of the clamp plates, for holding the stencil by attracting the undersurface side thereof.

According to this configuration, because the clamp side attracting means is provided to the clamp plates, the stencil can be attracted in a wide range by both the clamp side attracting means and the outer attracting means. It thus becomes possible to hold the stencil in a more stable state, which can further improve the printing accuracy.

Also, a printing method of the invention is characterized by including preparing a stencil to be disposed on a substrate, a squeegee slidable along a surface of the stencil, and outer attracting means disposed on an outside of a squeegee sliding region in which the squeegee slides over the stencil, and applying paste on the stencil onto the substrate by spreading the paste by sliding the squeegee along the surface of the stencil while the stencil is held by attracting an undersurface side thereof using the outer attracting means.

According to this invention, it is possible to provide a printing method that achieves the same effect described as above.

The invention claimed is:

1. A printing device that applies paste on a stencil onto a substrate by spreading the paste by sliding a squeegee along a surface of the stencil disposed on the substrate, comprising:
a pair of conveyors for conveying the substrate in a transport direction;
a stencil holding member, disposed above the paired conveyors, for holding the stencil in a state that the stencil is stretched over the substrate; and
an attracting block, disposed on the outside of the paired conveyors, and on the outside of a squeegee sliding region in which the squeeze slides along the stencil, wherein
the attracting block is disposed beneath the stencil, and includes an outer attracting member, disposed on a top surface of the attracting block for holding the stencil by sucking an undersurface of the stencil disposed on the substrate to attract the undersurface of the stencil onto the top surface of the attracting block, the paired conveyors are constituted of a fixed conveyor, and a movable conveyor which is movable in a direction orthogonal to the transport direction of the substrate with respect to the fixed conveyor to thereby change an interval of the paired conveyors in accordance with a size of the substrate, and the attracting block is fixedly mounted on the movable conveyor to thereby displace together with the movable conveyor which is moved for the interval of the paired conveyors.

2. The printing device according to claim 1, further comprising:

a pair of clamp plates for holding the substrate by pinching the substrate at both sides; wherein the clamp plates include a clamp side attracting member disposed on a top surface of each clamp plate for holding the stencil by sucking the undersurface side of the stencil disposed on the substrate to attract the undersurface side onto the top surfaces of the clamp plates.

3. The printing device according to claim 2, further comprising a pair of positioning plates contactable with a top surface of the substrate held between the paired clamp plates for positioning the substrate in a vertical direction, wherein the paired positioning plates are operable to displace between a positioning position at which the substrate is positioned on the clamp plates, and a retracted position at which the substrate is retracted from the positioning position toward the outside of the paired clamp plates, the attracting block is disposed on the outside of the paired positioning plates respectively disposed at the retracted position, the clamp plates, the positioning plates and the attracting block are disposed at such a position that the top surfaces of the clamp plates, the positioning plates and the attracting block are flush with one another in a state that the positioning plates are disposed at the retracted position, and the stencil is placed on the top surfaces of the clamp plates, the positioning plates, the attracting block, and the substrate held by the clamp plates.

* * * * *